United States Patent [19]

Ogihara et al.

[11] Patent Number: 5,712,827
[45] Date of Patent: Jan. 27, 1998

[54] DYNAMIC TYPE MEMORY

[75] Inventors: Masaki Ogihara; Satoru Takase; Kiyofumi Sakurai, all of Yokohama, Japan

[73] Assignee: Kabushiki Kaisha Toshiba, Kawasaki, Japan

[21] Appl. No.: 530,725

[22] Filed: Sep. 19, 1995

[30] Foreign Application Priority Data

Sep. 22, 1994 [JP] Japan ................ 6-227614

[51] Int. Cl.[6] ................ G11C 13/00; G11C 11/34
[52] U.S. Cl. ................ 365/230.03; 365/230.08; 365/230.02; 365/189.05; 365/189.02
[58] Field of Search ................ 365/230.01, 230.03, 365/230.05, 230.08, 230.02, 189.02, 189.05

[56] References Cited

U.S. PATENT DOCUMENTS

| | | | |
|---|---|---|---|
| 5,027,326 | 6/1991 | Jones | 365/221 |
| 5,126,973 | 6/1992 | Gallia et al. | 365/200 |
| 5,204,841 | 4/1993 | Chappell et al. | 365/230.05 |
| 5,251,178 | 10/1993 | Childers | 365/227 |
| 5,377,144 | 12/1994 | Brown | 365/189.02 |
| 5,459,693 | 10/1995 | Komarek et al. | 365/207 |
| 5,519,655 | 5/1996 | Greenberg | 365/189.02 |

*Primary Examiner*—Viet Q. Nguyen
*Attorney, Agent, or Firm*—Banner & Witcoff, Ltd.

[57] ABSTRACT

In a dynamic type memory, a memory cell array is divided into a plurality of sub arrays on a memory chip. Each of the sub arrays is provided with a data line formed in parallel with word lines. Data buffer and multiplexer circuits and I/O pads are arranged on one side of the memory chip in parallel with bit lines. This arrangement allows a data path to be shortened and enables data to be transferred at high speed.

24 Claims, 4 Drawing Sheets

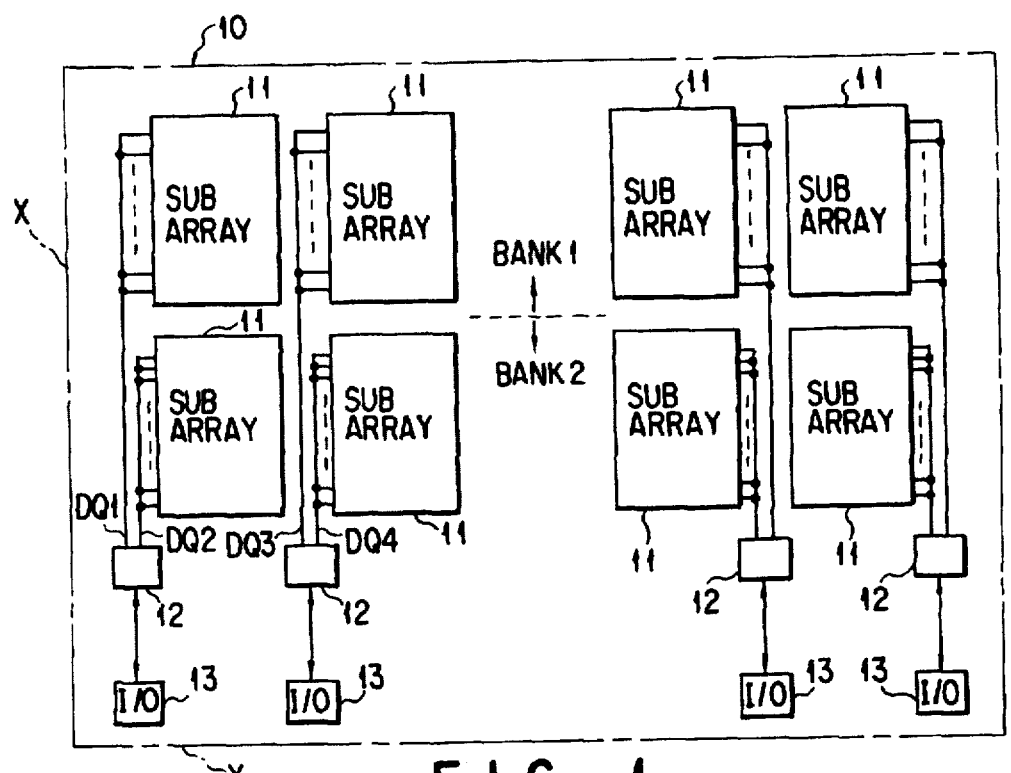
F I G. 1
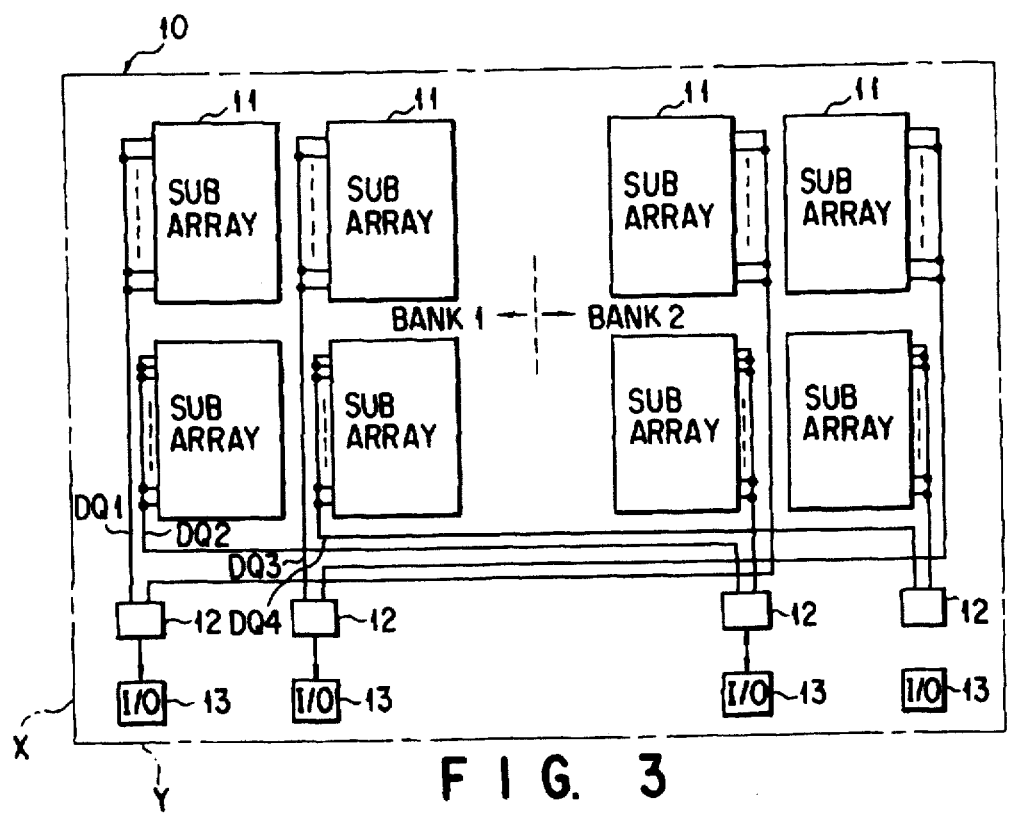
F I G. 3

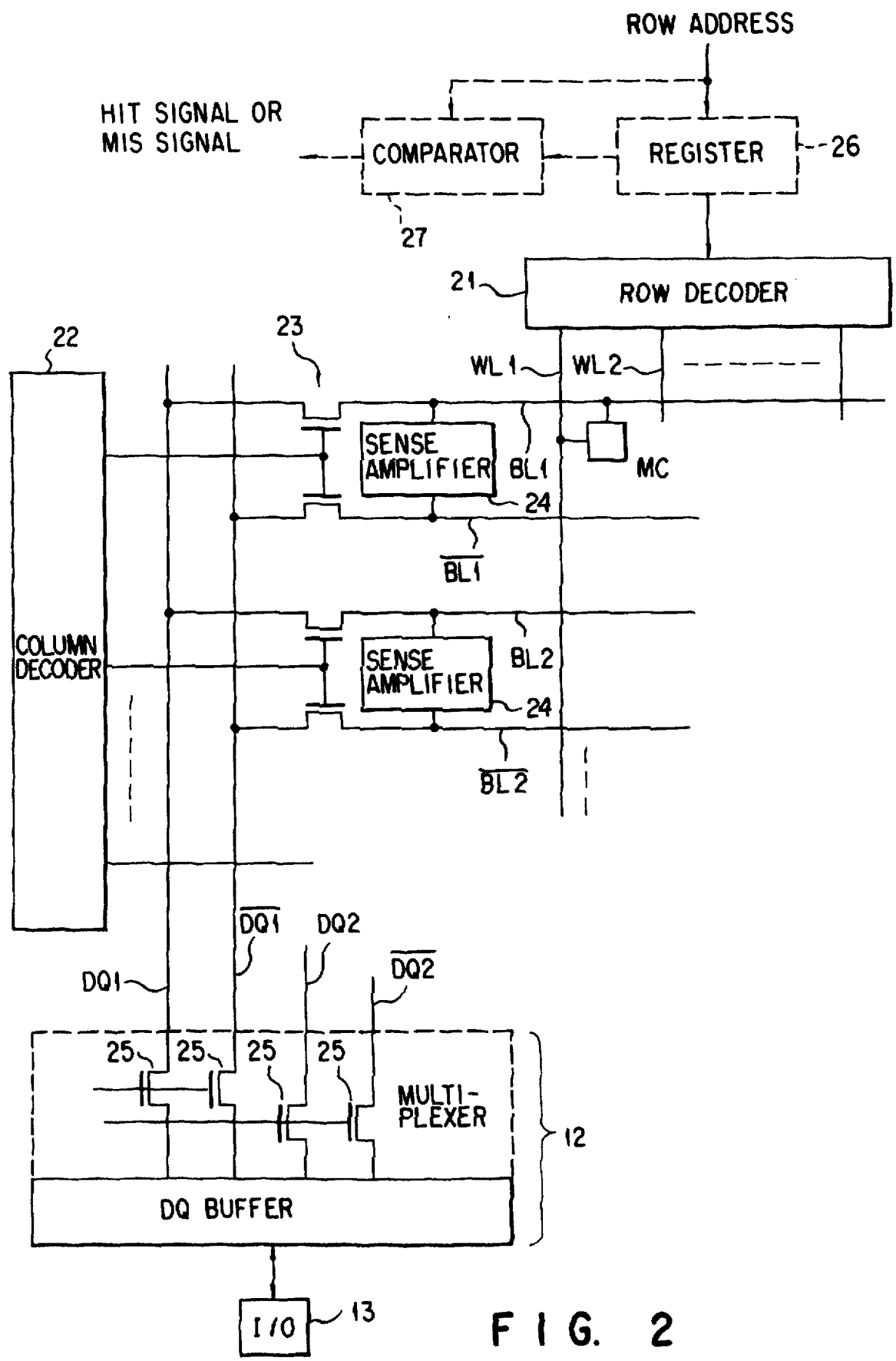
F I G. 2

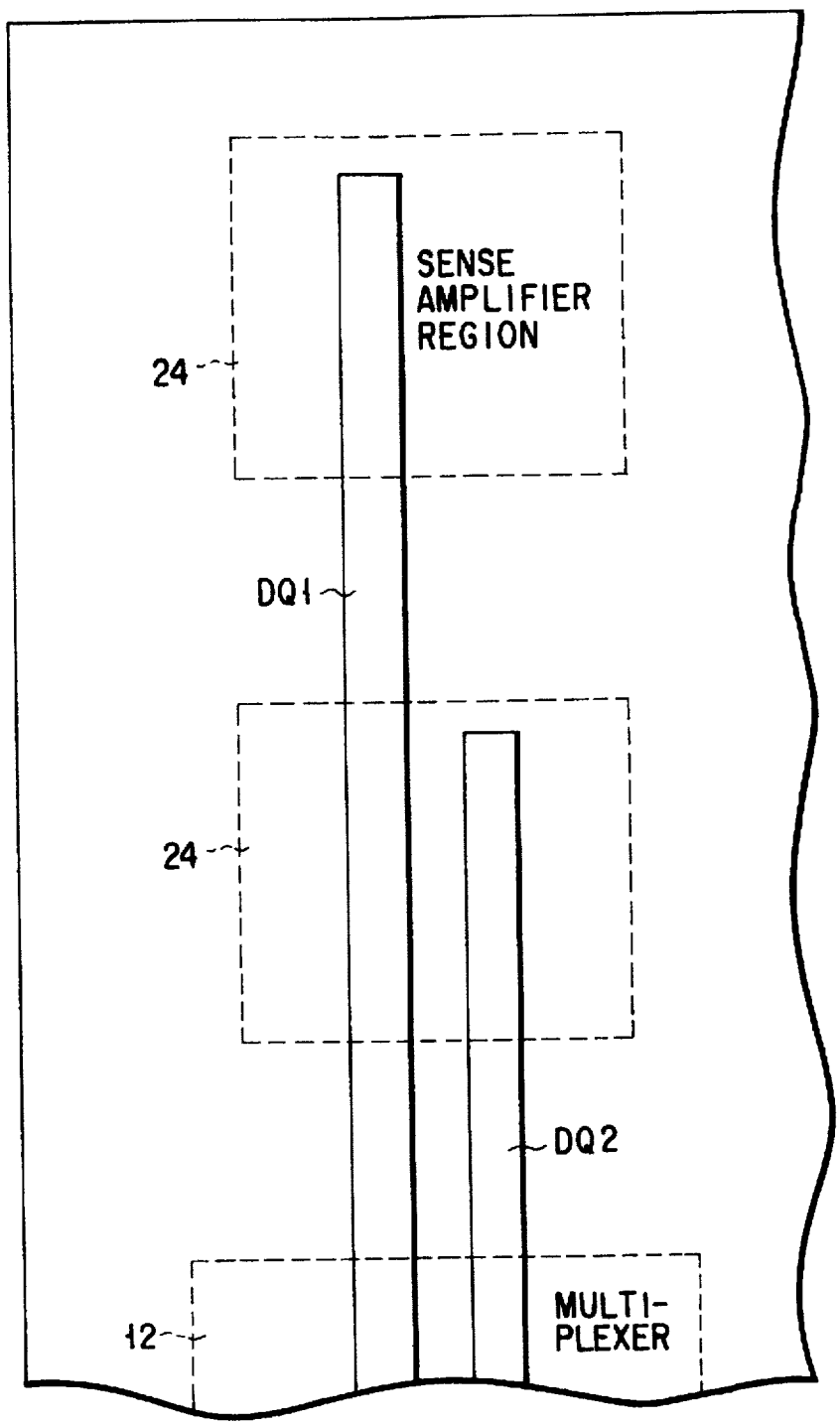
F I G. 5

DYNAMIC TYPE MEMORY

BACKGROUND OF THE INVENTION

1. Field of the Invention

The present invention relates to a semiconductor memory device and, more specifically, to a dynamic type memory or a dynamic RAM (DRAM) capable of transferring data at high speed through an input/output path.

2. Description of the Related Art

In a dynamic type memory, a divided cell array operating system is employed wherein a memory cell array is divided into a plurality of cell arrays (sub arrays) and some of the cell arrays are operated at the same time. This system makes it possible to reduce a charge/discharge current of bit lines which occupies a large part of the consumed current in an operation of rows. The number of sub arrays has a close relation to the operation speed of the memory. If each sub array is large in size, the capacity of word lines is increased too much and thus the rise and fall speeds of the word lines are decreased. Since the capacity of bit lines is also increased too much, a difference in potential between a pair of bit lines is lessened, and the speed at which the potential difference is amplified by a sense amplifier becomes slow, with the result that the operation speed of the entire memory is decreased. For this reason, as the memory is miniaturized and its capacity is increased, the number of sub arrays is likely to increase in order to reduce the charge/discharge current of the bit lines and then prevent the operation speed of the entire memory from lowering.

The semiconductor chip of a conventional versatile DRAM is applicable to a variety of bit configurations such as 1-bit, 4-bit, 8-bit, and 16-bit configurations and various types of packaging such as DIP, SOJ, TSOP and ZIP. For this reason, as shown in FIG. 4, a DQ buffer 43 for amplifying data of a data line 42 is provided in the vicinity of each of sub arrays 41 on the semiconductor chip, data of all the DQ buffers 43 are concentrated in a single multiplexer 44 arranged on the chip (in the center of the chip in FIG. 4), and data having a bit configuration is supplied from the multiplexer to an I/O pad 45 of its corresponding packaging.

According to the above conventional technique wherein all data read out from the sub arrays, which tend to increase in size, are concentrated on the chip, the data paths formed in the chip are lengthened to prevent data from being transferred at high speed.

In a specified DRAM chip, by concentrating the I/O pads on one side of the chip or using a vertical surface mounting package (VSMP) capable of being vertically mounted on a memory mounting printed circuit board, the lead frame in the package and the wires on the circuit board are shortened to increase in data transfer speed and, at the same time, to improve in data transfer rate by adopting a multi-bit configuration such as 8-bit and 16-bit configurations.

A dynamic RAM (DRAM) is achieved at low cost as a memory which is employed in bulk in a computer system. In the field of computers, the operation speed of a microprocessor (MPU) is remarkably improved and thus becomes higher and higher than that of the DRAM. The improvement in speed of data transfer between the MPU and DRAM is an important factor in increasing the processing speed of the total computer system. Various improvements have been made to increase the data transfer speed, and a typical one of them is to adopt a high-speed memory or a cache memory. The memory, which is interposed between the MPU and the main memory to shorten the difference between the cycle time of the MPU and the access time of the main memory, improves in efficiency in use of the MPU.

As examples of the cache memory, there are a static RAM (SRAM) of a chip separated from both a MPU chip and a DRAM chip, an SRAM called an on-chip cache memory or an embedded memory mounted on an MPU chip (an MPU chip mounted with a cache memory may have an SRAM cache memory of another chip), and an SRAM cell mounted on a DRAM chip.

The technique of mounting a cache memory including SRAM cells on a DRAM chip, is disclosed in "A Circuit Design of Intelligent CDDRAM with Automatic Write Back Capability," 1990 Symposium on VLSI Circuits, Digest of Technical Papers, pp 79–80. According to this technique, an SRAM cell is added to each column of a DRAM using cells each having one transistor and one capacitor, and this SRAM cell is employed as a cache memory. Moreover, when data of an address to be read out is not stored in the cache memory (mishit), the data of the cache memory is written back to a DRAM cell corresponding to the address, and then data stored in a DRAM cell of an address to be accessed are read out into the cache memory. This cache memory mounted DRAM can be employed together with a cache memory mounted MPU. The technique of using sense amplifiers of bit lines of a DRAM as cache memories is disclosed in Japanese Patent Application No. 3-41316 (Jpn. Pat. Appln. KOKAI Publication No. 4-212780) whose applicant is the same as that of the present application. A specific constitution of the cache memories and a specific control operation thereof are disclosed in Japanese Patent Application No. 3-41315 whose applicant is also the same as that of the present application.

Furthermore, Japanese Patent Application No. 4-131095, the applicant of which is the same as that of the present application, proposes a DRAM wherein a memory region is divided into a plurality of sub arrays, the sub arrays are operated independently of one another, and sense amplifiers of bit lines are employed as cache memories, thereby enhancing the hit rate of the cache memories.

Since, in this DRAM, a sense amplifier holds data read out from a row corresponding to each of different addresses for each of the sub arrays, a hit possibility of requesting access to a selected row can be increased, and the average of data access time, which depends on both the hit possibility and mishit possibility of not requesting the access, can be reduced.

A cache memory system using sense amplifiers will now be described in brief. Assume that a DRAM stands by for access from an MPU and, in this case, data read out from memory cells of a row address is latched in the sense amplifiers.

If there is access to the row address, data of whose memory cells is latched in the sense amplifiers (hit), the data can be output only by the operation of columns without that of rows, and access time necessary for the operation of rows can be shortened accordingly.

In contrast, if there is access to a row address, data of whose memory cells is not latched in the sense amplifiers (mishit), it is necessary that the data of the sense amplifiers is written back to the memory cells (or the sense amplifiers are equalized), and then data of a new row address be latched in the sense amplifiers. In this mishit case, the access time is much longer than when no cache memory system is employed.

If the hit rate of the cache memories is low, the average access time of the system is lengthened. To increase the hit rate is therefore important for shortening the average access time of the system.

In order to enhance the foregoing hit rate, there is a first method of increasing the capacity of each of the cache memories or a second method of dividing the cache memories into some banks.

If the first method is applied to the cache memory system using sense amplifiers, the sense amplifiers, which stand by for access while latching data, are increased in number. Generally, as described above, a large-capacity memory performs partial activation of activating some of sub arrays at the same time and, in this case, no data is usually held in the sense amplifiers related to the sub arrays in which an operation of rows is not performed. If, however, these sense amplifiers are caused to latch data, the sense amplifiers standing by for access while latching data, can be increased in number, as can be the capacity of the cache memories, thereby enhancing the hit rate.

If the above second method is applied to the cache memory system using sense amplifiers, these sense amplifiers are divided into a plurality of banks. In a versatile DRAM, generally, the sense amplifiers related to a plurality of sub arrays operate simultaneously to perform sensing, latching, and equalizing operations at the same timing, while the sense amplifiers related to the sub arrays in which an operation of rows is not performed, as described above, are allowed to stand by while latching data. The simultaneously-operating sense amplifiers are called banks. In order to divide the sense amplifiers into banks for the purpose of increasing the hit rate of the cache memories, the following conditions are required:

(1) Each bank has independent sense amplifiers.

(2) The sense amplifiers of a bank, in which an operation of rows is not performed, are able to continue latching data of the bank, irrespective of row addresses of the other banks.

(3) Each bank includes data paths corresponding to all I/O pads since a specific bank is accessed to access a certain cache memory, whereas in a multi-bit DRAM, data has to be supplied from the accessed bank to the I/O pads at the same timing.

The conventional DRAM described above has the problem in which, since data of all the sub arrays, which tend to increase in size, are concentrated on the chip, the data paths formed in the chip are lengthened to prevent data from being transferred at high speed.

SUMMARY OF THE INVENTION

The present invention has been developed in order to resolve the above problem and its object is to provide a dynamic type memory capable of increasing the speed of data transfer by shortening data paths formed in a chip and enhancing the hit rate of a cache memory when a cache memory system using sense amplifiers is adopted.

According to the present invention, there is provided a dynamic type memory comprising:

a memory cell array formed on a semiconductor chip having a first edge and a second edge perpendicular to the first edge;

a plurality of sub arrays into which the memory cell array is divided, the plurality of sub arrays being arranged in a first direction parallel to the first edge and a second direction perpendicular to the first direction, and grouped into a plurality of banks, each of the plurality of sub arrays having a plurality of memory cells arranged in matrix;

a plurality of word lines formed on the semiconductor memory chip for each of the plurality of sub arrays and extending in the first direction, each of the plurality of word lines being connected to those of the memory cells which are in a row;

a plurality of bit lines formed on the semi-conductor memory chip for each of the plurality of sub arrays and extending in the second direction, each of the plurality of bit lines being connected to those of the memory cells which are in a column;

a plurality of sense amplifiers formed on the semiconductor memory chip for each of the plurality of sub arrays and connected to the plurality of bit lines, each for sensing and amplifying a potential read out from a memory cell when a corresponding bit line is selected;

a plurality of data lines formed on the semiconductor memory chip for the plurality of sub arrays and extending in the first direction in which the word lines extend, each of the plurality of data lines being connected to the sense amplifiers of a corresponding sub array, for transferring data sensed and amplified by a sense amplifier the bit line connected to which is selected;

a plurality of data buffer and multiplexer circuits formed on the semiconductor memory chip in the second direction, each of the plurality of data buffer and multiplexer circuits being connected to one of the sub arrays of each of the banks; and a plurality of input/output pads connected to the data buffer and multiplexer circuits, the input/output pads being in an arrangement in the second direction on the semiconductor memory chip, the arrangement being, closer to the second edge of the semiconductor memory chip than the data buffer and multiplexer circuits.

All the data lines are formed in parallel with the word lines, and the data buffer and multiplexer circuits and input/output pads are arranged locally on one side of the memory chip in parallel with the bit lines.

Since these data lines, data buffer and multiplexer circuits, and input/output pads are arranged with efficiency, the data paths formed in the memory chip are shortened and thus data can be transferred at high speed.

One data buffer and multiplexer circuit is connected to the data lines of a sub array of each of the banks, and each of the banks has data paths connected to the input/output pads. Therefore, when a sense amplifier cache memory system using the sense amplifiers as cache memories is adopted, data of the banks can be multiplexed and the hit rate of the cache memories can be increased.

Each of the banks may comprise those of the sub arrays which are grouped in the second direction.

Each of the banks may comprise those of the sub arrays which are grouped in the first direction.

It is preferable that those of the data lines which are provided for those of the sub arrays which are far from the input/output pads are over those of the sub arrays which are near to the input/output pads.

It is also preferable that those of the data lines which are provided for those of the sub arrays which are far from the input/output pads are close to those of the sub arrays which are near to the input/output pads.

It is preferable that a size of those of the data lines which are provided for those of the sub arrays which are far from the input/output pads is larger than that of those of the data lines which are provided for those of the sub arrays which are near to the input/output pads.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a view of the arrangement of sub arrays, DQ buffer and multiplexer circuits and I/O pads in a chip of a DRAM according to a first embodiment of the present invention;

FIG. 2 is a circuit diagram showing part of the arrangement of FIG. 1 including one sub array, one DQ buffer and multiplexer circuit and one I/O pad;

FIG. 3 is a view of the arrangement of sub arrays, DQ buffer and multiplexer circuits and I/O pads in a chip of a DRAM according to a second embodiment of the present invention;

FIG. 5 is a partial pattern view of the arrangement shown in FIG. 1.

DETAILED DESCRIPTION OF THE PREFERRED EMBODIMENTS

Figure 4:
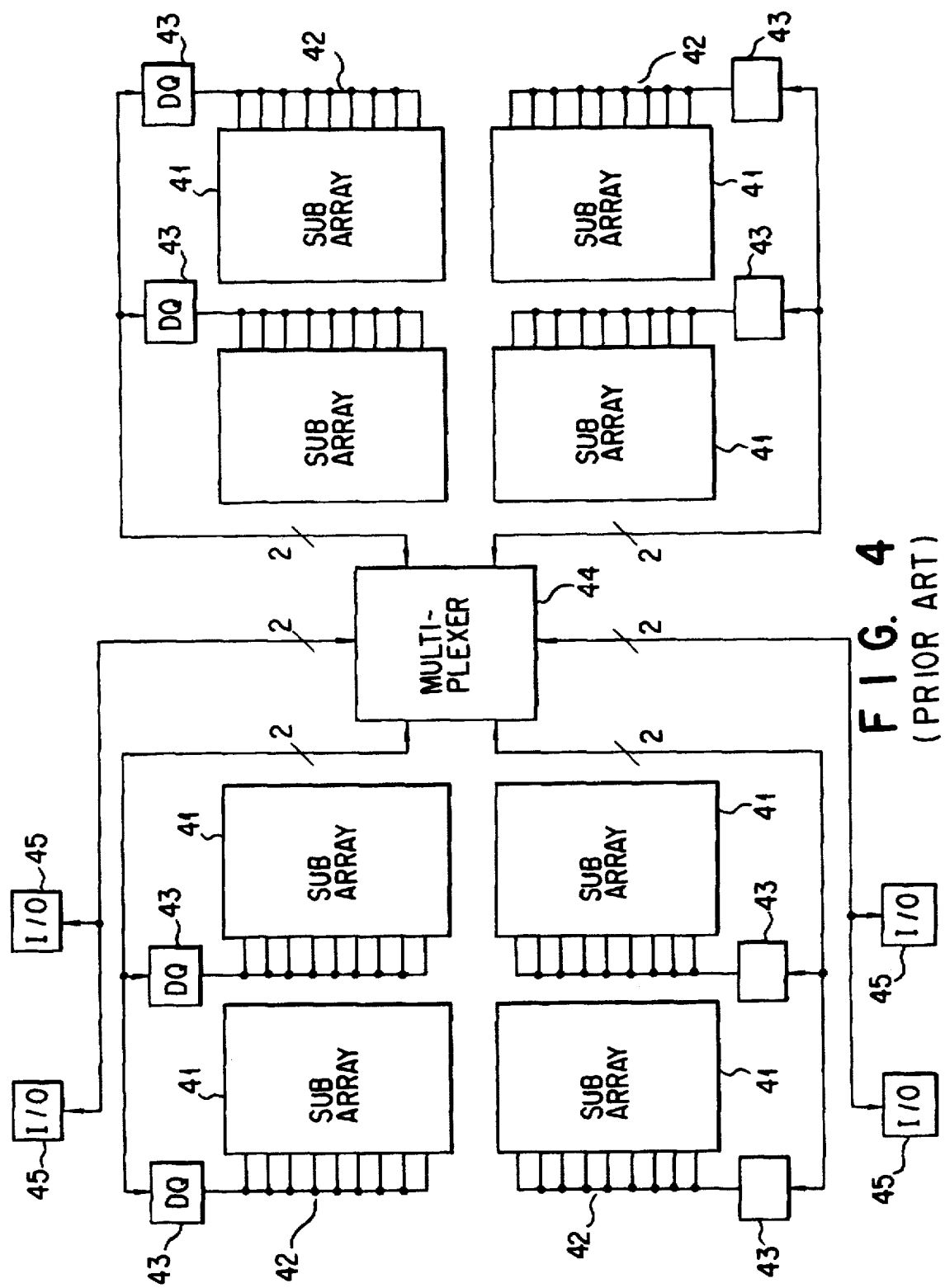
FIG. 4 is a view of the arrangement of sub arrays, DQ buffers, a multiplexer and I/O pads in a chip of a conventional versatile DRAM.

Embodiments of the present invention will now be described in detail with reference to the accompanying drawings.

FIG. 1 shows an example of the arrangement of sub arrays 11, DQ buffer and multiplexer circuits 12 and I/O pads 13 in a DRAM chip according to a first embodiment of the present invention, and FIG. 2 specifically shows part of the arrangement of FIG. 1 including one sub array 11, one DQ buffer and multiplexer circuit 12 and one I/O pad 13.

Each of the sub arrays 11 shown in FIG. 1 includes dynamic type memory cells MC (FIG. 2) arranged in matrix on a memory chip 10 in the first and second directions X and Y perpendicular to each other. The sub arrays 11 are grouped into a plurality of banks and the operations of the sub arrays 11 are controlled for each of the banks. In the first embodiment, the groups of sub arrays 11 are arranged in the first direction X, and the total of groups comes to two. In this first embodiment, each of the groups includes such arrays 11 arranged in a line in the second direction Y and corresponds to one bank.

As shown in FIG. 2, each of the sub arrays 11 includes a plurality of word lines WLi (i=1, 2, ...) each connected to the memory cells MC on the same row and formed in the first direction X and a plurality of pairs of bit lines BLi and $\overline{BLi}$ (i=1, 2, ...) each connected to the memory cells MC on the same column and formed in the second direction Y. The word lines WLi are selected by a row decoder 21, while the bit lines BLi and $\overline{BLi}$ are selected by a column selection circuit 23 selected by a column decoder 21. Each of the sub arrays also includes a plurality of sense amplifiers 24 for amplifying the potentials read out from the memory cells MC on a row selected by the row decoder 21.

A plurality of pairs of data lines DQi and $\overline{DQi}$, each of which is connected to its corresponding sub array 11, extend in parallel with the word lines WLi to transfer data supplied from one of the sense amplifiers 24 on a selected column of the sub array 11.

Each of the DQ buffer and multiplexer circuits 12 is connected to the pairs of data lines DQi and $\overline{DQi}$ of a corresponding sub array 11 of each of the banks to amplify data supplied through the pairs of data lines. The DQ buffer and multiplexer circuits 12 are arranged in the second direction Y.

Each of the I/O pads 13 is connected to its corresponding one of the DQ buffer and multiplexer circuits 12, and these pads are arranged in the second direction Y and nearer to the edge of the memory chip than the buffer and multiplexer circuits 12 are.

To connect the data lines of different banks is unfavorable since the load capacity of the data lines is increased and thus the delay in data transfer is lengthened. In the first embodiment, therefore, a multiplexer of each of the DQ buffer and multiplexer circuits 12 includes switching elements (e.g., MOS transistors 25) corresponding to the data lines DQi and $\overline{DQi}$ of the different banks, and each of the switching elements is connected in series between its corresponding data line and I/O pad 13, as is illustrated in FIG. 2. Consequently, data can be input/output to/from the different banks by the DQ buffer and multiplexer circuits 12.

The data lines (DQ1, DQ3, ... in FIG. 1) connected to the sub arrays of one bank located far from the I/O pads 13 are longer than those (DQ2, DQ4, ... in FIG. 1) connected to the sub arrays of the other bank located near to the I/O pads 13. In order to make the wiring resistance of the data lines substantially equal, the wiring resistance of the longer data lines has to be prevented from increasing. It is thus desirable to make the longer data lines wider than the shorter data lines.

Furthermore, the longer data lines, which are connected to the sub arrays of the bank located far from the I/O pads, pass by or over the sub arrays including sense amplifiers of the bank located near to the I/O pads. FIG. 5 is a partial pattern view in which the data line DQ1 extending from the far located bank and the data line DQ2 extending from the near located bank are formed on an insulation film. The data line DQ1 extending from the far located bank passes over the sense amplifier region of the sub array of the near located bank.

In the DRAM of the first embodiment, all the data lines DQi and $\overline{DQi}$ are formed in parallel with the word lines WLi, and the DQ buffer and multiplexers 12 and I/O pads 13 are arranged on one side of the memory chip 10.

As described above, since the data lines DQi, $\overline{DQi}$, DQ buffer and multiplexer circuits 12 and I/O pads 13 are arranged with efficiency, the data paths formed in the chip 10 are shortened, as are the lead frame in the package and the wires on the circuit board, with the result that data can be transferred at high speed.

As described above, in the first embodiment, the plurality of sub arrays 11 are grouped into a plurality of banks arranged in the first direction X of the memory chip 10, each of the DQ buffer and multiplexer circuits 12 is connected to the data lines DQi of a corresponding sub array of each of different banks, and each of the banks has data paths connected to the corresponding I/O pads 13.

If a cache memory system in which a sense amplifier of each sub array is employed as a cache memory is applied to the first embodiment, data can be read out of the different banks independently and thus the hit rate of the cache memory can be increased. If, in this case, the sense amplifiers of one bank are so constructed that they keep holding the current data even in the access standby mode of the bank, regardless of the access to another bank, the number of sense amplifiers latching data is increased and the hit rate of the cache memory can be enhanced further.

The configuration to which the cache memory system is applied is similar to that of Japanese Patent Application No. 4-131095 the applicant of which is the same as that of the present application. As indicated by the dotted line in FIG. 2, this configuration includes a register circuit 26 for holding a row address for each sub array and a comparator 27 for comparing the row address (corresponding to a selected row) held in the register circuit 26 with a new row address.

When a sub array is supplied with an access request and a row address, the comparator 27 compares the two row addresses described above. If they coincide with each other, the comparator outputs a hit signal, and data of a column corresponding to a column address is output without any operation of the rows. If they do not coincide, it outputs a mishit signal, and the register 26, word line WLi and sense amplifier 24 are reset and then the new row address is set in the register circuit 26. The rows are operated in accordance with the new row address held in the register circuit 26. The sub array is supplied again with an access request and a row address to determine whether a hit or a mishit occurs. In the case of hit, data of a column corresponding to a column address is read out without any operation of the rows. The above operations are performed in the plurality of sub arrays 11 by sequentially supplying the sub arrays 11 with an access request. In each of the sub arrays 11, only the row in which a mishit occurs can be selected and thus all the rows need not be selected every time a mishit occurs.

FIG. 3 shows an example of the arrangement of sub arrays 11, DQ buffer and multiplexer circuits 12 and I/O pads 13 in a memory chip of a DRAM according to a second embodiment of the present invention.

The second embodiment differs from the first embodiment only in that the sub arrays 11 are grouped into two banks in the second direction Y of the memory chip. In FIG. 3, the same structural elements as those in FIG. 1 are denoted by the same reference numerals.

The DRAM of the second embodiment is able to perform the same operation as that of the DRAM of the first embodiment and achieve substantially the same advantage as that of the latter DRAM.

Specifically, each of the sub arrays 11 shown in FIG. 3 includes dynamic type memory cells MC (FIG. 2) arranged in matrix on a memory chip 10 in the first and second directions X and Y perpendicular to each other. The sub arrays 11 are grouped into a plurality of banks and the operations of the sub arrays 11 are controlled for each of the banks. In the second embodiment, the groups of sub arrays 11 are arranged in the second direction Y, and the total of groups comes to two. In this second embodiment, each of the groups includes such arrays 11 arranged in two lines in the first direction X and corresponds to one bank. As shown in FIG. 2, each of the sub arrays 11 includes a plurality of word lines WLi (i=1, 2, ...) each connected to the memory cells MC on the same row and formed in the first direction X and a plurality of pairs of bit lines BLi and $\overline{BLi}$ (i=1, 2, ...) each connected to the memory cells MC on the same column and formed in the second direction Y. The word lines WLi are selected by a row decoder 21, while the bit lines BLi and $\overline{BLi}$ are selected by a column selection circuit 23 selected by a column decoder 21. Each of the sub arrays also includes a plurality of sense amplifiers 24 for amplifying the potentials read out from the memory cells MC on a row selected by the row decoder 21.

A plurality of pairs of data lines DQi and $\overline{DQi}$, each of which is connected to its corresponding sub array 11, extend in parallel with the word lines WLi to transfer data supplied from one of the sense amplifiers 24 on a selected column of the sub array 11.

Each of the DQ buffer and multiplexer circuits 12 is connected to the pairs of data lines DQi and $\overline{DQi}$ of a corresponding sub array 11 of each of the banks to amplify data supplied through the pairs of data lines. The DQ buffer and multiplexer circuits 12 are arranged in the second direction Y.

Each of the I/O pads 13 is connected to its corresponding one of the DQ buffer and multiplexer circuits 12, and these pads are arranged in the second direction Y and nearer to the edge of the memory chip than the buffer and multiplexer circuits 12 are.

To connect the data lines of different banks is unfavorable since the load capacity of the data lines is increased and thus the delay in data transfer is lengthened. Therefore, a multiplexer of each of the DQ buffer and multiplexer circuits 12 includes switching elements (e.g., MOS transistors 25) corresponding to the data lines DQi and $\overline{DQi}$ of the different banks, and each of the switching elements is connected in series between its corresponding data line and I/O pad 13, as is illustrated in FIG. 2. Consequently, data can be input/output to/from the different banks by the DQ buffer and multiplexer circuits 12.

The data lines (DQ1, DQ3, ... in FIG. 3), which are connected to the sub arrays located far from the I/O pads 13, pass by or over the sub arrays located near to the I/O pads. The pattern view of the data lines may be the same as that shown in FIG. 5.

Also, in the DRAM of the second embodiment, the DQ buffer and multiplexers 12 and I/O pads 13 are arranged on one side of the memory chip 10. On the other hand, the data lines DQi and $\overline{DQi}$ include not only portions in parallel with the word lines WLi but also portions perpendicular to the word lines WLi. However, the total length of the data paths is shorter than that of the prior art arrangement shown in FIG. 4 in which all of the data paths is connected to a single multiplexer.

As described above, since the data lines DQi, $\overline{DQi}$, DQ buffer and multiplexer circuits 12 and I/O pads 13 are arranged with efficiency, the data paths formed in the chip 10 are shortened, as are the lead frame in the package and the wires on the circuit board, with the result that data can be transferred at high speed.

As described above, in the second embodiment, the plurality of sub arrays 11 are grouped into a plurality of banks arranged in the second direction Y of the memory chip 10, each of the DQ buffer and multiplexer circuits 12 is connected to the data lines DQi of a corresponding sub array of each of different banks, and each of the banks has data paths connected to the corresponding I/O pads 13.

If a cache memory system in which a sense amplifier of each sub array is employed as a cache memory is applied to the second embodiment, data can be read out of the different banks independently and thus the hit rate of the cache memory can be increased. If, in this case, the sense amplifiers of one bank are so constructed that they keep holding the current data even in the access standby mode of the bank, regardless of the access to another bank, the number of sense amplifiers latching data is increased and the hit rate of the cache memory can be enhanced further.

The configuration to which the cache memory system is applied is similar to that of Japanese Patent Application No. 4-131095 the applicant of which is the same as that of the present application. As indicated by the dotted line in FIG. 2, this configuration includes a register circuit 26 for holding a row 10 address for each sub array and a comparator 27 for comparing the row address (corresponding to a selected row) held in the register circuit 26 with a new row address.

When a sub array is supplied with an access request and a row address, the comparator 27 compares the two row addresses described above. If they coincide with each other, the comparator outputs a hit signal, and data of a column corresponding to a column address is output without any operation of the rows. If they do not coincide, it outputs a mishit signal, and the register 26, word line WLi and sense amplifier 24 are reset and then the new row address is set in the register circuit 26. The rows are operated in accordance with the new row address held in the register circuit 26. The sub array is supplied again with an access request and a row address to determine whether a hit or a mishit occurs. In the case of hit, data of a column corresponding to a column address is read out without any operation of the rows. The above operations are performed in the plurality of sub arrays 11 by sequentially supplying the sub arrays 11 with an access request. In each of the sub arrays 11, only the row in which a mishit occurs can be selected and thus all the rows need not be selected every time a mishit occurs.

As described above, according to the present invention, the data paths formed in the semiconductor chip are shortened, data can be transferred at high speed, and the hit rate of the cache memory can be raised if a cache memory system using sense amplifiers is adopted.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A dynamic type memory comprising:
   a memory cell array formed on a semiconductor chip having a first edge and a second edge perpendicular to the first edge;
   a plurality of sub arrays into which said memory cell array is divided, said plurality of sub arrays being arranged in a first direction parallel to the first edge and a second direction perpendicular to said first direction, and grouped into a plurality of banks, each of said plurality of sub arrays having a plurality of memory cells arranged in matrix;
   a plurality of word lines formed on the semiconductor memory chip for each of said plurality of sub arrays and extending in the first direction, each of said plurality of word lines being connected to those of the memory cells which are in a row;
   a plurality of bit lines formed on the semiconductor memory chip for each of said plurality of sub arrays and extending in the second direction, each of said plurality of bit lines being connected to those of the memory cells which are in a column;
   a plurality of sense amplifiers formed on the semiconductor memory chip for each of said plurality of sub arrays and connected to said plurality of bit lines, each for sensing and amplifying a potential read out from a memory cell when a corresponding bit line is selected;
   a plurality of data lines formed on the semiconductor memory chip for said plurality of sub arrays and extending in the first direction in which said word lines extend, each of said plurality of data lines being connected to the sense amplifiers of a corresponding sub array, for transferring data sensed and amplified by a sense amplifier the bit line connected to which is selected;
   a plurality of data buffer and multiplexer circuits formed on the semiconductor memory chip in the second direction and in parallel to said second edge of said semiconductor memory chip, each of said plurality of data buffer and multiplexer circuits being connected to one of said sub arrays of each of said banks; and
   a plurality of input/output pads connected to said data buffer and multiplexer circuits, the input/output pads being in an arrangement in the second direction on the semiconductor memory chip and being in parallel to said second edge of said semiconductor memory chip, the arrangement being closer to the second edge of the semiconductor memory chip than said data buffer and multiplexer circuits.

2. A dynamic type memory according to claim 1, wherein said banks are spaced apart from each other in said second direction.

3. A dynamic type memory according to claim 1, wherein said banks are spaced apart from each other in said first direction.

4. A dynamic type memory according to claim 1, wherein those of said data lines which are provided for those of said sub arrays which are far from said input/output pads are over those of said sub arrays which are near to said input/output pads.

5. A dynamic type memory according to claim 2, wherein those of said data lines which are provided for those of said sub arrays which are far from said input/output pads are over those of said sub arrays which are near to said input/output pads.

6. A dynamic type memory according to claim 3, wherein those of said data lines which are provided for those of said sub arrays which are far from said input/output pads are over those of said sub arrays which are near to said input/output pads.

7. A dynamic type memory according to claim 1, wherein those of said data lines which are provided for those of said sub arrays which are far from said input/output pads are arranged above portions of those of said sub arrays which are near to said input/output pads.

8. A dynamic type memory according to claim 2, wherein those of said data lines which are provided for those of said sub arrays which are far from said input/output pads are arranged above portions of those of said sub arrays which are near to said input/output pads.

9. A dynamic type memory according to claim 3, wherein those of said data lines which are provided for those of said sub arrays which are far from said input/output pads are arranged above portions of those of said sub arrays which are near to said input/output pads.

10. A dynamic type memory according to claim 1, wherein a size of those of said data lines which are provided for those of said sub arrays which are far from said input/output pads is larger than that of those of the data lines which are provided for those of said sub arrays which are near to said input/output pads.

11. A dynamic type memory according to claim 2, wherein a size of those of said data lines which are provided for those of said sub arrays which are far from said input/ output pads is larger than that of those of the data lines which are provided for those of said sub arrays which are near to said input/output pads.

12. A dynamic type memory according to claim 3, wherein a size of those of said data lines which are provided for those of said sub arrays which are far from said input/output pads is larger than that of those of the data lines which are provided for those of said sub arrays which are near to said input/output pads.

13. A semiconductor memory device, comprising:
   a semiconductor chip formed on a semiconductor substrate;
   a memory cell array formed on said semiconductor chip, said memory cell array comprising sub arrays organized into memory banks which are spaced apart from each other in one of a first and a second direction;
   data buffer and multiplexer circuits formed on said semiconductor chip and spaced apart from each other in the second direction, each data buffer and multiplexer circuit being connected to a sub array from each memory cell bank; and
   input/output pads formed on said semiconductor chip and spaced apart from each other in the second direction, each input/output pad being connected to a corresponding data buffer and multiplexer circuit,
   wherein said data buffer and multiplexer circuits are arranged between said input/output pads and said sub arrays.

14. A semiconductor memory device according to claim 13, wherein said sub arrays comprise dynamic memory cells arranged in rows and columns.

15. A semiconductor memory device according to claim 14, further comprising:
   word lines each connecting the dynamic memory cells in a row of one of said sub arrays, said word lines extending in the first direction.

16. A semiconductor memory device according to claim 15, further comprising:
   bit lines each connecting the dynamic memory cells in a column of one of said sub arrays, said bit lines extending in the second direction.

17. A semiconductor memory device according to claim 16, further comprising:
   sense amplifiers for sensing and amplifying potentials of said bit lines.

18. A semiconductor memory device according to claim 13, further comprising:
   data lines for connecting said sub arrays to said data buffer and multiplexer circuits.

19. A semiconductor memory device according to claim 18, wherein said data buffer and multiplexer circuits are connected to the sub arrays of a first memory cell bank by first ones of said data lines having a first size and to the sub arrays of a second memory cell bank by second ones of said data lines having a second size different than the first size.

20. A semiconductor memory device according to claim 18, wherein said data buffer and multiplexer circuits comprise switching elements connected between said data lines and said input/output pads.

21. A semiconductor memory device according to claim 13, wherein said memory cell banks are spaced apart from each other in the first direction.

22. A semiconductor memory device according to claim 13, wherein said memory cell banks are spaced apart from each other in the second direction.

23. A semiconductor memory device, comprising:
   a semiconductor chip formed on a semiconductor substrate;
   a memory cell array formed on said semiconductor chip, said memory cell array comprising sub arrays organized into memory banks which are spaced apart from each other in one of a first and a second direction, each sub array comprising memory cells arranged in rows and columns;
   word lines extending in the first direction and provided for each sub array, each word line connecting memory cells in a row of the corresponding sub array;
   bit lines extending in the second direction and provided for each sub array, each bit line connecting memory cells in a column of the corresponding sub array;
   data buffer and multiplexer circuits formed on said semiconductor chip and spaced apart from each other in the second direction;
   data lines including at least data line potions extending in the first direction and connecting said sub arrays and said data buffer and multiplexer circuits such that each data buffer and multiplexer circuit is connected to a sub array from each memory cell bank; and
   input/output pads formed on said semiconductor chip and spaced apart from each other in the second direction, each input/output pad being connected to a corresponding data buffer and multiplexer circuit,
   wherein said data buffer and multiplexer circuits are arranged between said input/output pads and said sub arrays.

24. A semiconductor memory device according to claim 23, wherein said data buffer and multiplexer circuits are connected to the sub arrays of a first memory cell bank by first ones of said data lines having a first size and to the sub arrays of a second memory cell bank by second ones of said data lines having a second size different than the first size.

* * * * *